(12) United States Patent
Mao et al.

(10) Patent No.: US 10,839,740 B2
(45) Date of Patent: Nov. 17, 2020

(54) PANEL AND TILED DEVICE THEREOF

(71) Applicant: Innolux Corporation, Miao-Li County (TW)

(72) Inventors: Li-Wei Mao, Miao-Li County (TW); Chin-Lung Ting, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/352,965

(22) Filed: Mar. 14, 2019

(65) Prior Publication Data

US 2019/0325812 A1 Oct. 24, 2019

Related U.S. Application Data

(60) Provisional application No. 62/659,192, filed on Apr. 18, 2018.

(30) Foreign Application Priority Data

Sep. 7, 2018 (CN) .......................... 2018 1 1043894

(51) Int. Cl.
*G09G 3/22* (2006.01)
*G06F 3/14* (2006.01)
*G09F 9/302* (2006.01)

(52) U.S. Cl.
CPC ............. *G09G 3/22* (2013.01); *G06F 3/1446* (2013.01); *G09F 9/3026* (2013.01)

(58) Field of Classification Search
CPC .. G09G 3/22; G09G 3/3208; G09G 2300/026; G09G 2300/0439; G06F 3/1446; G09F 9/3026; H01L 51/56; H01L 51/5246; H01L 51/525; H01L 25/0753; H01L 27/3258; H01L 27/3272; H01L 2227/323; H01L 33/46; H01L 33/465

See application file for complete search history.

(56) References Cited

U.S. PATENT DOCUMENTS

| | | | | |
|---|---|---|---|---|
| 9,385,343 | B2 * | 7/2016 | Li | H01L 51/5284 |
| 2007/0080905 | A1 * | 4/2007 | Takahara | G09G 3/3258 |
| | | | | 345/76 |
| 2010/0072496 | A1 * | 3/2010 | Kobayakawa | H01L 25/0753 |
| | | | | 257/91 |
| 2014/0084775 | A1 | 3/2014 | Kobori | |
| 2015/0138041 | A1 * | 5/2015 | Hirakata | H01L 51/0097 |
| | | | | 345/1.3 |
| 2017/0025399 | A1 * | 1/2017 | Takeya | H01L 33/502 |
| 2017/0033323 | A1 * | 2/2017 | Chida | H01L 51/0097 |

(Continued)

FOREIGN PATENT DOCUMENTS

WO 2016121258 A1 8/2016

OTHER PUBLICATIONS

EPO Search Report dated Aug. 19, 2019 in EP application (No. 19166591.8-1211).

*Primary Examiner* — Tom V Sheng
(74) *Attorney, Agent, or Firm* — McClure, Qualey & Rodack, LLP

(57) ABSTRACT

A panel includes a substrate having a top surface; a plurality of light-emitting elements disposed on the top surface of the substrate; and a shielding layer disposed between the plurality of light-emitting elements, wherein the shielding layer has a gloss unit lower than 100.

20 Claims, 8 Drawing Sheets

(56) References Cited

U.S. PATENT DOCUMENTS

| | | |
|---|---|---|
| 2017/0104137 A1 | 4/2017 | Kobayakawa |
| 2017/0337870 A1* | 11/2017 | Lin .......................... G09G 3/32 |
| 2018/0076368 A1 | 3/2018 | Hussell |
| 2018/0151645 A1* | 5/2018 | Lee ..................... H01L 51/5271 |
| 2018/0277528 A1 | 9/2018 | Hasegawa et al. |
| 2019/0115561 A1* | 4/2019 | Tang ................... H01L 27/3258 |
| 2019/0165218 A1* | 5/2019 | Nakai ................... H01L 33/483 |
| 2019/0288092 A1* | 9/2019 | Katayama ......... H01L 29/66969 |

* cited by examiner

PANEL AND TILED DEVICE THEREOF

This application claims the benefit of U.S. provisional application Ser. No. 62/659,192, filed Apr. 18, 2018 and People's Republic of China application Serial No. 201811043894.7, filed Sep. 7, 2018, the subject matters of which are incorporated herein by reference.

BACKGROUND

Field of the Invention

The present disclosure relates in general to a panel and a tiled device thereof, and more particularly to a panel including a light-emitting element and a tiled device thereof.

Description of the Related Art

With the increasing demand for panels in the market, people have increasing demand for the display quality of panels. In particular, the screen of the panel may be affected by ambient light, which makes the panel having a poor display quality, so that the viewer cannot have a good visual enjoyment.

Therefore, there is still an urgent need to develop a panel that can improve display quality.

SUMMARY OF THE INVENTION

The disclosure is directed to a panel and a tiled device thereof or other electronic device. Since the panel and the tiled device of the panel of the present disclosure have a shielding layer, the display quality of the panel can be effectively improved.

According to one aspect of the present disclosure, a panel is provided. The panel includes a substrate, a plurality of light-emitting elements, and a shielding layer. The substrate has a top surface. The light-emitting element is disposed on the top surface of the substrate. The shielding layer is disposed between the light-emitting elements, wherein the shielding layer has a Gloss Unit (GU) of less than 100.

According to another aspect of the present disclosure, a tiled device of a panel is provided. The tiled device includes a plurality of the above panels.

The above and other aspects of the invention will become better understood with regard to the following detailed description. The following description is made with reference to the accompanying drawings.

BRIEF DESCRIPTION OF THE DRAWINGS

FIG. 1O is another partial enlarged view of FIG. 1A.

FIG. 1O is a further partial enlarged view of FIG. 1A.

DETAILED DESCRIPTION OF THE INVENTION

It will be understood that when an element or layer is referred to as being "on", "disposed on" or "connected to" another element or layer, it can be directly disposed on or directly connected to the other element or layer, or intervening elements or layers may be present. In contrast, when an element is referred to as being "directly disposed on" or "directly connected to" another element or layer, there are no intervening elements or layers exist.

Use of ordinal terms such as "first", "second", "third", etc., in the specification and claims to modify an element does not by itself connote any priority, precedence, or order of one claim element over another or the temporal order in which acts of a method are performed, but are used as labels to distinguish one claim element having a certain name from another element having the same name (but for use of the ordinal term) to distinguish the claim elements.

The present specification provides various embodiments to illustrate the technical features of various embodiments of the present invention. The arrangement of the components in the embodiments is for illustrative purposes and is not intended to limit the invention. The partially repeated numerals of the drawings in the embodiments are for the purpose of simplifying the description, and do not mean the relationship between the different embodiments.

The panel of the present disclosure has a shielding layer, and the shielding layer can have a low reflectivity or gloss, which can reduce the influence of ambient light on the panel, so that the display quality can be improved.

Figure 1A:
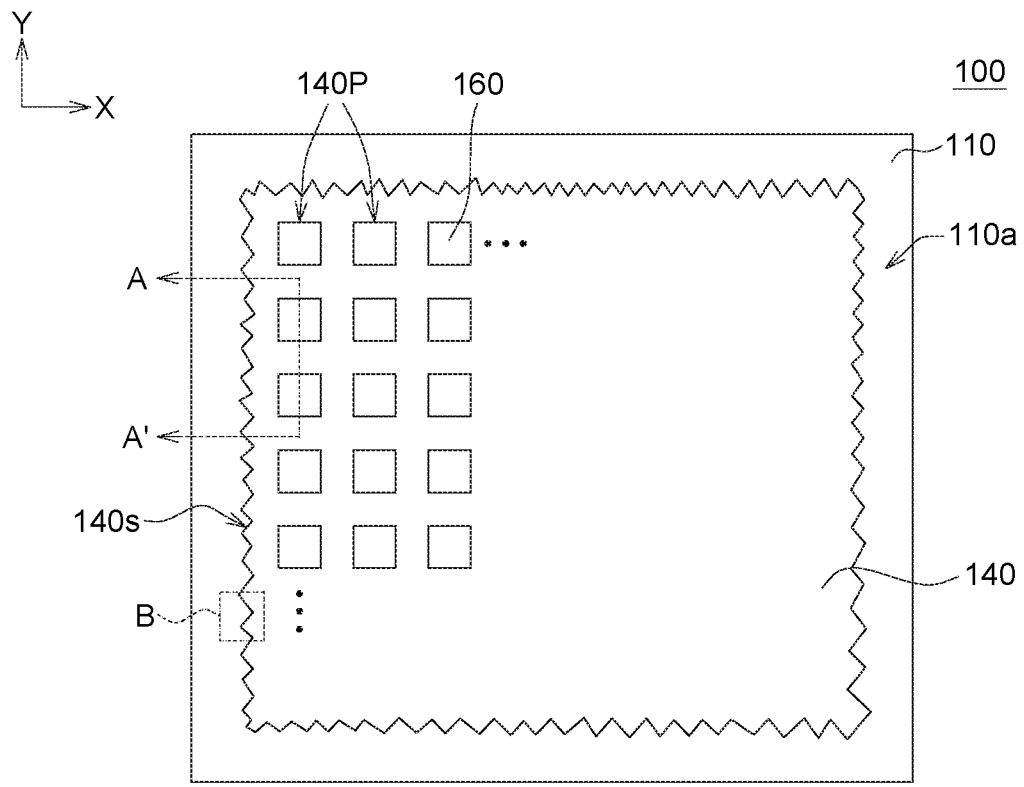
FIG. 1A is a top view showing a panel according to one embodiment of the present disclosure.
Figures 1B, 1C, 1D:
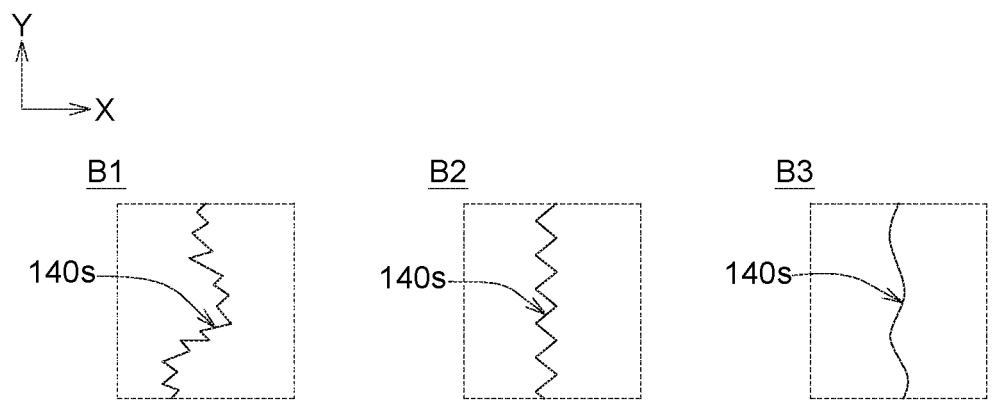
FIG. 1B is a partial enlarged view of FIG. 1A.

FIG. 1A illustrates a top view of a panel 100 according to one embodiment of the present disclosure. FIG. 1B is a partial enlarged view of the panel 100 of FIG. 1A. FIG. 1O is another partial enlarged view of the panel 100 of FIG. 1A. FIG. 1D is a further partial enlarged view of the panel 100 of FIG. 1A.

Referring to FIG. 1A, the panel 100 may include a substrate 110. The substrate 110 may have a rectangular shape on a plane formed by the X-axis and the Y-axis, and may be a square, a rectangle, a circle, or other free shape. The side of the substrate 110 near the viewer has a top surface 110a. A plurality of light-emitting elements 160 may be disposed on the top surface 110a to form an array of light-emitting elements arranged in a matrix, and the array of light-emitting elements may be used to display the image. The shielding layer 140 may be disposed between the light-emitting elements 160, and has a shape corresponding or similar to the substrate 110, for example, a rectangle, or may be a square, a rectangle, a circle, or other free shapes. The substrate 110 may be a rigid substrate or a flexible substrate. The substrate material may include glass, plastic or other material suitable as a substrate, and the substrate 110 may be a multilayer composite substrate.

The material of the shielding layer 140 may be a material having low reflectivity or low gloss, for example, may comprise graphene or nano carbon material, and the nano carbon material may include, for example, carbon tube or carbon sphere or its composition. In an embodiment, the color of the shielding layer 140 may be black or other dark color having low reflectivity or low gloss. In an embodiment, the shielding layer 140 may directly contact the light-emitting element 160. In some embodiments, the shielding layer 140 and the light-emitting element 160 may have a gap therebetween to be separated from each other. In the present embodiment, the shielding layer 140 has a plurality of openings 140P, and each opening 140P may correspond to one light-emitting element 160. However, the disclosure is not limited thereto, and one opening 140P may correspond to a plurality of light-emitting elements. In other words, the shielding layer 140 may surround the light-emitting element 160 to encircle the periphery of the light-emitting element 160.

The light-emitting element 160 may include a first type semiconductor layer (e.g., P type) and a second type semiconductor layer (e.g., N type). The light-emitting layer is disposed between the first type semiconductor layer and the second type semiconductor layer, but is not limited thereto. The light-emitting element 160 may be, for example, an organic light-emitting element or an inorganic light-emitting element, but is not limited thereto. The structure of the light-emitting element 160 may be a vertical light-emitting element, a horizontal light-emitting element or a flip-chip light-emitting element, and the light-emitting element may also comprise a quantum dot material. The light emitted by the light-emitting element 160 may have the same color or a different color, or may be, for example, a package element having three primary colors of RGB. If the light-emitting elements 160 have different colors, one light-emitting element 160 corresponds to a sub-pixel region, and a plurality of sub-pixel regions constitute one pixel region, and the plurality of pixel regions constitute a pixel matrix. However, if the light-emitting element itself can emit a package element such as RGB three primary colors, one light-emitting element 160 corresponds to one pixel area.

In one embodiment, the shielding layer 140 may be disposed on the substrate 110 by coating, injecting or screen printing, or may be transferred to the substrate 110 after the patterned shielding layer is completed. The shielding layer 140 has a side surface 140s near the boundary of the substrate 110, and the shielding layer 140 may have four side surfaces 140s on a plane formed by the X-axis and the Y-axis. In one embodiment, the side surfaces 140s can have an even profile. In another embodiment, the side surfaces 140s may have an uneven profile, as exemplified in FIG. 1A. That is, the profile from the vertical projection onto the top surface 110a of the substrate 110 is not a straight line but has an appearance of at least partially wavy, bent or irregular. Taking the portion B of the side surface 140s as an example, there may be an appearance as shown in FIGS. 1B, 1C and 1D. For example, in a partial enlarged view of the portion B1 of FIG. 1B, the profile of the side surfaces 140s may be irregular. In a partially enlarged view of portion B2 of FIG. 1O, the profile of the side surfaces 140s may be regular zigzag. In a partially enlarged view of portion B3 of FIG. 1D, the profile of the side surfaces 140s may be a regular wave shape. However, the disclosure is not limited thereto, and the profile of the side surface 140s may be other non-linear shapes, or any combination of the above shapes.

Figure 2:
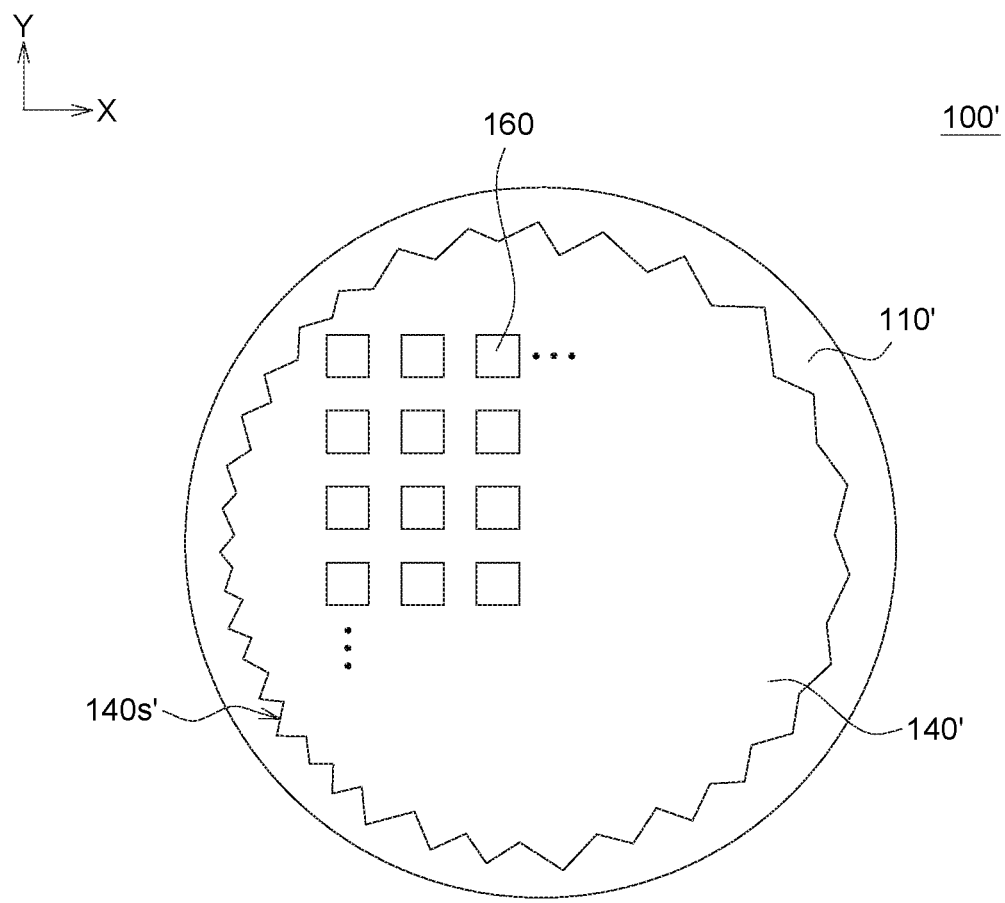
FIG. 2 is a top view showing a panel according to another embodiment of the present disclosure.

FIG. 2 is a further partial enlarged view of the panel 100' of FIG. 1A. FIG. 2 and FIG. 1A have similar elements and arrangements, except that on the plane formed by the X-axis and the Y-axis, the panel 100' of FIG. 2 has a circular substrate 110', and the shielding layer 140' has a corresponding shape of the substrate 110', which is, for example, close to a circular shape. Similarly, the side surface 140s' of the shielding layer 140' may have an uneven profile, such as the above-mentioned irregular shape, regular zigzag shape, regular wave shape, other non-linear appearance, or any arbitrary combination of the above shapes. In this embodiment, the shielding layer 140 may be electrically conductive or non-conductive, but the disclosure is not limited thereto.

Figure 3A:
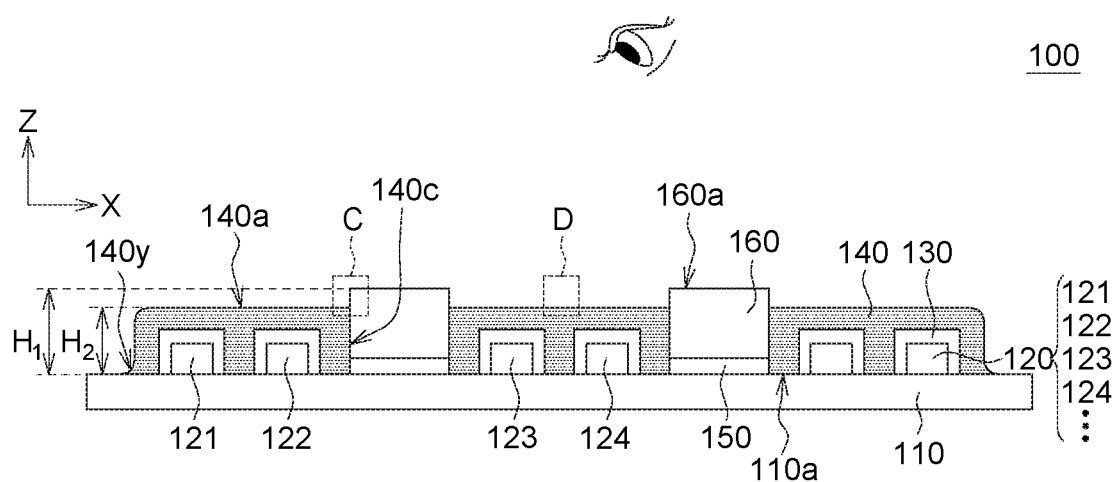
FIG. 3A is a cross-sectional view taken along A-A of FIG. 1A showing a panel according to one embodiment.
Figure 3B:
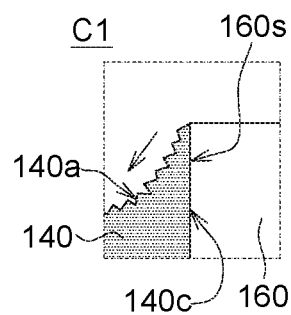
FIG. 3B is a partial enlarged view of a panel of FIG. 3A.
Figure 3C:
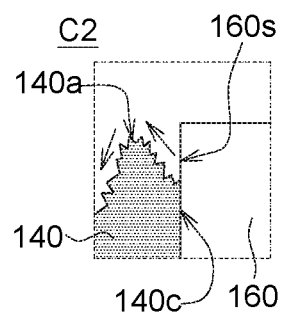
FIG. 3C is another partial enlarged view of a panel of FIG. 3A.
Figure 3D:
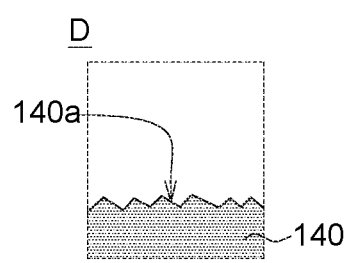
FIG. 3D is a further partial enlarged view of a panel of FIG. 3A.

FIG. 3A is a cross-sectional view showing an embodiment taken along A-A line of the panel 100 of FIG. 1A. FIG. 3B is a partial enlarged view of the panel 100 of FIG. 3A. FIG. 3C is another partial enlarged view of the panel 100 of FIG. 3A. FIG. 3D is a further partial enlarged view of the panel 100 of FIG. 3A.

Referring to FIG. 3A, a cross-sectional view of the panel 100 on the plane formed by the X-axis and the Z-axis is shown. The top surface 110a of the substrate 110 may have a conductive layer 120 thereon. Conductive layer 120 may comprise a metallic material or other suitable electrically conductive material, such as copper, silver, or ITO. The conductive layer 120 may include a plurality of wires 121, 122, 123, 124, which may be electrostatic protection wires, common electrode wires, ground wires, or other traces. The pad 150 may be disposed on the top surface 110a between the light-emitting element 160 and the substrate 110. In one embodiment, the conductive layer 120 may be disposed under the light-emitting element 160 between the pad 150 and the substrate 110. The light-emitting elements 160 can be electrically connected to the substrate 110 by the pad 150 and the conductive layer 120. The insulating layer 130 may be disposed at least between the conductive layer 120 and the shielding layer 140.

If the shielding layer 140 is electrically conductive, the insulating layer 130 can insulate the conductive layer 120 so that the shielding layer 140 does not directly contact the conductive layer 120. The insulating layer 130 can further cover and enclose the conductive layer 120, which is decided by design requirements, but not limited thereto. The shielding layer 140 may be disposed at least on the conductive layer 120 or further cover all of the conductive layer 120 and the insulating layer 130 as long as it can block the light from being irradiated onto the conductive layer 120, thereby reducing the influence to the display contrast caused by the reflectivity or the gloss. That is, the insulating layer 130 and the conductive layer 120 may be disposed between the substrate 110 and the shielding layer 140. In a direction parallel to the top surface 110a, the wires 121, 122, 123, 124, . . . may be separated from the shielding layer 140 by the insulating layer 130. In addition, in another embodiment, the shielding layer 140 may be disposed between the light-emitting element 160 and the conductive layer 120 and the insulating layer 130, In other words, the shielding layer 140 may surround the periphery of the light-emitting elements 160 and the periphery of the conductive layer 120 and the insulating layer 130. Viewed in a direction perpendicular to the top surface 110a, a portion of the shielding layer 140 overlaps the conductive layer 120, and a portion of the shielding layer 140 does not overlap the conductive layer 120, but is offset from the conductive layer 120. In this way, when ambient light is irradiated onto the conductive layer 120 to generate reflected light, the shielding layer 140 can absorb the reflected light at different angles of the conductive layer 120, which can effectively reduce the possibility that the ambient light affects the display quality of the screen.

In the present embodiment, the shielding layer 140 may directly contact the light-emitting element 160. That is, the shielding layer 140 may be connected to each of the light-emitting elements 160 to form a connecting surface 140c. Referring to FIG. 3B, in a portion C1 of the adjacent region where the shielding layer 140 is connected to the light-emitting element 160, the vertical height between at least a portion of the top surface 140a of the shielding layer 140 and the top surface 110a of the substrate 110 is decreased from the connecting surface 140c to the direction away from the light-emitting element 160, as indicated by the arrows. Referring to FIG. 3C, in the portion C2, the vertical height between at least a portion of the top surface 140a of the shielding layer 140 and the top surface 110a of the substrate 110 firstly increases from the connecting surface 140c to the direction away from the light-emitting element 160, reaching a highest point and then decreasing from the highest point, as indicated by the arrow. However, the disclosure is not limited thereto, and there is still other kinds of attachment between the shielding layer 140 and the light-emitting element 160. If the light is not required to be illuminated by the side surface 160s of the light-emitting element 160, the embodiment of FIG. 3B can be used to have the side surface 160s of the light-emitting element 160 being covered by the shielding layer 140. If the light emitting from the side surface 160s of the light-emitting element 160 is required, the embodiment of FIG. 3C can be used to expose at least a portion of the side surface 160s of the light-emitting element 160 by the shielding layer 140. In the embodiments of the above embodiments, the patterned shape or material property (for example, viscosity) of the shielding layer 140 can be adjusted. For example, the adhesion between the shielding layer 140 and the light-emitting element 160 can be different, and the manner in which the shielding layer 140 is attached to the light-emitting element 160 is also different. The pattern of the shielding layer 140 has different heights to prevent the external glare from being concentrated and reflected to a certain viewer angle and affecting the viewing, thereby improving the display quality.

Referring again to FIG. 3A, the top surface 140a of the shielding layer 140 may be an even surface. Referring to FIG. 3D, the top surface 140a of the shielding layer 140 may be an uneven surface. As shown in portion D, the top surface 140a may have some slight wavy curves, which is not limited thereto, and may also be a mixed combination, depending on the design requirements. If the top surface of the shielding layer is an uneven surface, the concave and convex structure of the uneven surface can be further utilized to scatter the light, so as to avoid the concentration of the strong light outside the specific angle to affect the viewing, thereby improving the display quality.

In another embodiment, the shielding layer 140 has a curved edge 140y at a position farthest from the light-emitting element 160 and near the side surface 140s, and may have a thickness gradually decreasing toward the direction away from the light-emitting element 160, and the feature that the thickness is gradually decreased can reduce the risk of peeling off the shielding layer 140.

In one embodiment, the panel 100 may further include a wavelength conversion layer (not shown). The wavelength conversion layer can be a single layer or a multilayer structure, and the material thereof includes color resist, quantum dots (rods), fluorescent materials, or other suitable materials, or a combination of the foregoing materials. The wavelength conversion layer can respectively correspond to different light-emitting elements 160, or if the light-emitting element 160 is encapsulated, the wavelength conversion layer can also be directly disposed in the encapsulation body.

In another embodiment, the panel 100 may include a cover layer (not shown), and the cover layer may be a protective layer, an encapsulation layer, a water blocking layer, or a transparent glass plate. The cover layer can be disposed on the light emitting element 160. The wavelength conversion layer can be disposed on the shielding layer 140 and the light-emitting element 160. The wavelength conversion layer can be selectively disposed between the light emitting element 160 and the cover layer. The shielding layer 140 and the light-emitting element 160 may be disposed on the same substrate 100, and the shielding layer 140 may directly contact the substrate 110 and/or the insulating layer 130. The shielding layer 140 may be disposed between the wavelength conversion layer and the substrate 110 in a direction perpendicular to the top surface 110a of the substrate 110.

Referring to FIG. 3A again, in one embodiment, a first height $H_1$ is between the top surface 160a of the light-emitting element 160 and the top surface 110a of the substrate 110 as viewed in the cross-sectional view. When the top surface 160a of the light-emitting element 160 is uneven, the first height $H_1$ refers to the maximum height between the top surface 160a of the light-emitting element 160 and the top surface 110a of the substrate 110. The second height $H_2$ is between the top surface 140a of the shielding layer 140 and the top surface 110a of the substrate 110. When the top surface 140a of the shielding layer 140 is uneven, the second height $H_2$ refers to the maximum height between the top surface 140a of the shielding layer 140 and top surface 110a of the substrate 110. The first height $H_1$ and the second height $H_2$ meet the following Formula 1:

$$0.01*H_1 < H_2 < 2*H_1 \quad \text{Formula 1}$$

In another embodiment, the first height $H_1$ and the second height $H_2$ meet the following Formula 2:

$$0.01*H_1 < H_2 < H_1 \quad \text{Formula 2}$$

If it is desired that the light-emitting angle of the light-emitting element is larger, the height of the shielding layer 140 may be lower than the height of the light-emitting element.

In a further embodiment, the first height $H_1$ and the second height $H_2$ meet the following Formula 3:

$$H_1 < H_2 < 2*H_1 \quad \text{Formula 3}$$

If it is desired that the light-emitting angle of the light-emitting element is smaller, the height of the shielding layer 140 may be larger than the height of the light-emitting element.

In an embodiment, the top surface 140a of the shielding layer 140 is 1 millimeter (mm) or 0.5 mm higher than the top surface 160a of the light-emitting element 160. In an embodiment, the top surface 160a of the light-emitting element 160 is 1 millimeter (mm) or 0.5 millimeters higher than the top surface 140a of the shielding layer 140. The shielding layer 140 itself has a thickness that can be greater than 1 micrometer.

Optical parameters that affect display quality have reflectivity or gloss unit (GU). Reflectivity is the ratio of the power of the reflected wave to the power of the incident wave in an interface reflection. Gloss unit is used to describe the reflective properties with direction selection. Therefore, in one embodiment, if a display device (for example, a television, an NB, an office screen) used in general indoor ambient light is considered, or if it is desired to have an aesthetically pleasing consideration for the design, the shielding layer may be selected to have a higher gloss unit but a lower reflectivity to make the overall display more uniform. In one embodiment, when considering the optical characteristics of the outdoor display device or the display device that is often used under strong light, it is desirable to increase the contrast of the display screen due to external light irradiation, so that the shielding layer having a lower gloss unit can be selected.

In one embodiment, optical characteristics of the panel 100 of the present disclosure can be measured by using a DMS instrument. Under the wavelength of 380~780 nm, the DMS instrument is used for the positive viewing angle measurement, and the measurement range is the integral of the absolute value with the viewing angle between 0 and 60 degrees, and the reflectivity of the shielding layer 140 of the panel 100 is less than 10% (<10%), or may be less than 6% (<6%). In another embodiment, the shielding layer 140 of the panel 100 may have a reflectivity of less than 1% (<1%).

In one embodiment, optical properties of the panel 100 of the present disclosure can be measured by using a BYK Gardner gloss meter. The gloss unit of the shielding layer 140 of the panel 100 is measured at a wavelength of 380 to 780 nm by using the BYK Gardner gloss meter at a viewing angle of 60 degrees, and is less than 100 (<100), or may be less than 50 (<50). In another embodiment, the shielding layer 140 of the panel 100 may have a gloss unit of less than 10 (<10).

Please refer to Table 1 below, which shows the reflectivity and gloss unit of Experimental Examples 1 to 5 of the shielding layer of the panel according to the embodiment of the present disclosure. The reflectivity was measured by using a DMS instrument for positive viewing angle, and the gloss unit was measured by using a BYK Gardner gloss meter for 60 degrees. The surface resistance is measured by an SRM instrument. The pencil hardness is measured by a pencil hardness tester. Adhesion is measured by the Cross-Cut method.

TABLE 1

| | Experimental Examples 1-5 | | | | |
|---|---|---|---|---|---|
| | Example 1 | Example 2 | Example 3 | Example 4 | Example 5 |
| reflectivity (%) | 0.05 | 0.31 | 0.43 | 1.52 | 5.71 |
| Gross Unit | 0 | 83 | 92 | 115 | 2 |
| resistance ($\Omega/\square$) | <10^3 | >10^12 | >10^12 | 10^8 | 10^11 |
| Pencil hardness | — | 2H | 2H | 2H | HB |
| adhesion | — | 5B | 5B | 5B | 4B |

As can be seen from Table 1, the shielding layer of Experimental Examples 1 to 5 all have a low reflectivity of less than 6%. Therefore, if the shielding layer is desired to have a lower reflectivity, Experimental Examples 1 to 5 can be selected. Under external light, if the reflectivity is small, the overall display picture is relatively uniform, and has good display quality.

The gloss unit of each of Experimental Examples 1 to 3 and Experimental Example 5 was less than 100. Moreover, the gloss unit of Experimental Example 1 and Experimental Example 5 may be less than 50, or the gloss unit may be less than 10. Therefore, if it is desired to enhance the contrast under strong light or sunlight, the shielding layer may be selected to have a lower gloss unit. In this case, the experimental examples 1 to 3 and the experimental example 5 can be selected.

If the electrical properties of the shielding layer are further considered, the experimental examples 2 and 3, which have the higher resistance (for example, the resistance is greater than $10^{\wedge}12\Omega/\square$) and the gloss unit and reflectivity meeting the above numerical range, may be selected.

However, if the electrical properties of the shielding layer are not considered, the experimental example 1 can be selected. The reflectivity of the experimental example 1 is less than 1% and the gloss unit is almost 0, which can improve the display contrast or display quality.

Figure 4:
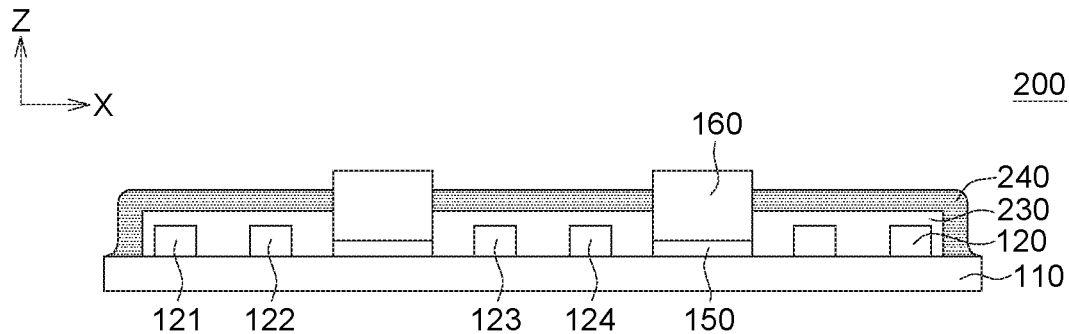
FIG. 4 is a cross-sectional view showing a panel according to a further embodiment of the present disclosure.

It can be seen that the panel 100 of the present disclosure can have a smaller reflectivity or gross unit due to the use of the shielding layer 140 compared to the conventional use of a black insulating paint or a black mask as a comparative example of absorbing ambient light design. The reflected light of the ambient light in the panel 100 (for example, the reflected light formed by the ambient light on the conductive layer 120) can be effectively reduced, so that the display quality of the screen can be significantly improved, and the contrast can be improved without a sense of graying. FIG. 4 is a cross-sectional view of a panel 200 according to a further embodiment of the present disclosure. The panel 200 is different from the panel 100 of FIG. 3 in that the insulating layer 230 and the shielding layer 240 are arranged differently.

Referring to FIG. 4, the insulating layer 230 covers the conductive layer 120 (wires 121, 122, 123, 124, . . . ) on the entire surface, and the shielding layer 240 covers the insulating layer 230. The wires 121, 122, 123, 124 . . . are separated by an insulating layer 230, but are not separated by the shielding layer 240. The chemical properties, formation manner and dimensional design of the shielding layer 240 and the shielding layer 140 described above may be the same or similar, and the repeated descriptions are not described.

Figure 5:
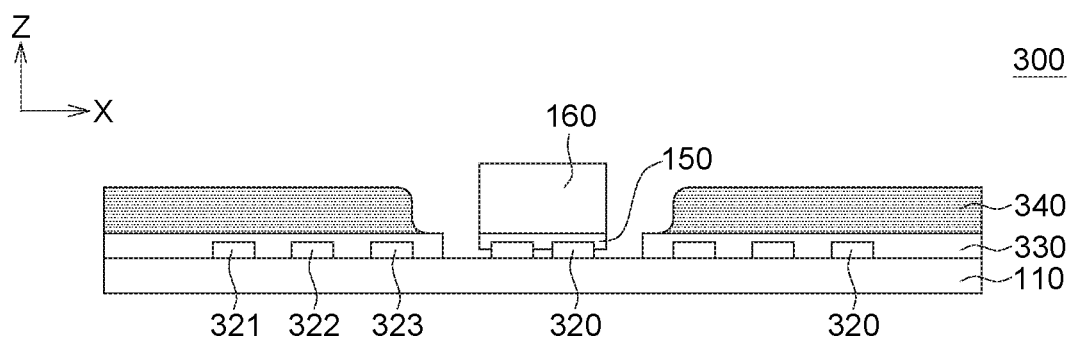
FIG. 5 is a cross-sectional view showing a panel according to a further embodiment of the present disclosure.

FIG. 5 is a cross-sectional view of a panel 300 according to a further embodiment of the present disclosure. The panel 300 is different from the panel 100 of FIG. 3 in that the insulating layer 330 and the shielding layer 340 are arranged differently.

Referring to FIG. 5, in addition to the conductive layer 320 disposed under the light-emitting element 160, the insulating layer 330 covers the conductive layer 320 (wires 321, 322, 323, . . . ) on the entire surface, and the shielding layer 340 covers a portion of the insulating layer 330, and a portion of the insulating layer 330 is exposed. The wires 321, 322, 323 . . . are separated by an insulating layer 330. In the present embodiment, the shielding layer 340 and the insulating layer 330 have a gap with the light-emitting element 160, that is, the light-emitting element 160 and the shielding layer 340 and the insulating layer 330 are separated from each other and do not contact each other. The chemical properties, formation manner and dimensional design of the shielding layer 340 and the shielding layer 140 described above may be the same or similar, and the repeated description will not be described.

Figure 6:
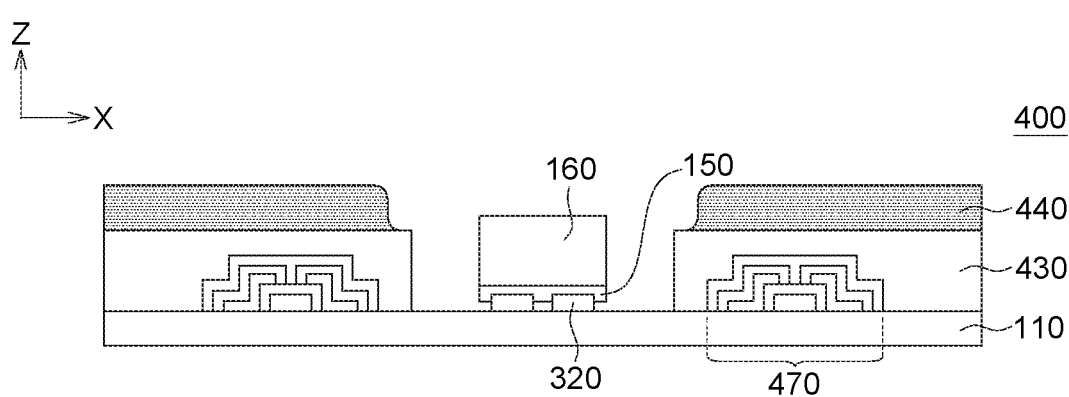
FIG. 6 is a cross-sectional view showing a panel according to a further embodiment of the present disclosure.

FIG. 6 is a cross-sectional view of a panel 400 according to a further embodiment of the present disclosure. The panel 400 is different from the panel 300 of FIG. 5 in that a driving element 470 is further disposed on the top surface 110a of the substrate 110.

Referring to FIG. 6, the insulating layer 430 covers the at least one driving element 470, and the shielding layer 440 covers the at least one driving element 470 and the insulating layer 430. The driving element 470 and the shielding layer 440 may be separated by an insulating layer 430. The driving element 470 can be a thin film transistor or other switching element, and the driving element 470 can further include more than one, and is not limited herein. The chemical properties, formation manner and dimensional design of the shielding layer 440 and the shielding layer 140 described above may be the same or similar, and the repeated description will not be described.

Figure 7:
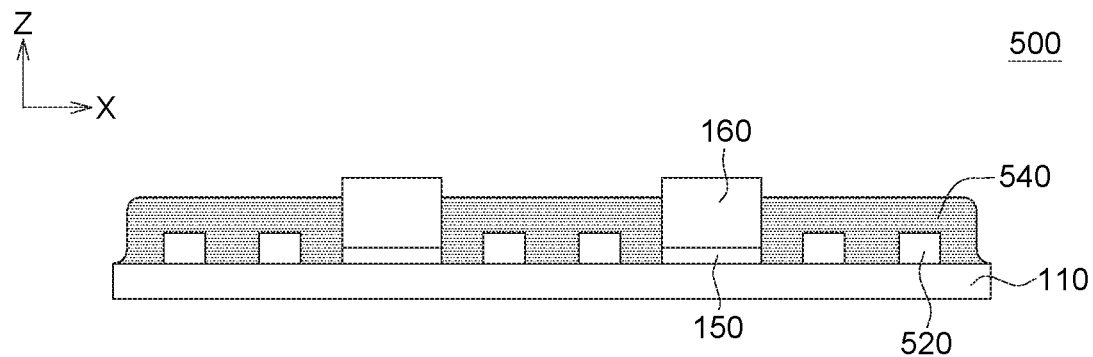
FIG. 7 is a cross-sectional view showing a panel according to a further embodiment of the present disclosure.

FIG. 7 is a cross-sectional view of a panel 500 according to a further embodiment of the present disclosure. The panel 500 is different from the panel 100 of FIG. 3 in that the shielding layer 540 directly contacts the conductive layer 520.

Referring to FIG. 7, there is no insulating layer between the shielding layer 540 and the conductive layer 520. The material of the shielding layer 540 may be an insulating coating comprising nano carbon material mixed insulating material, and has an insulating property. The shielding layer 540 and the shielding layer 140 described above may have the same or similar reflectivity, formation manner and dimensional design, and the repeated descriptions will not be not described.

Figure 8:
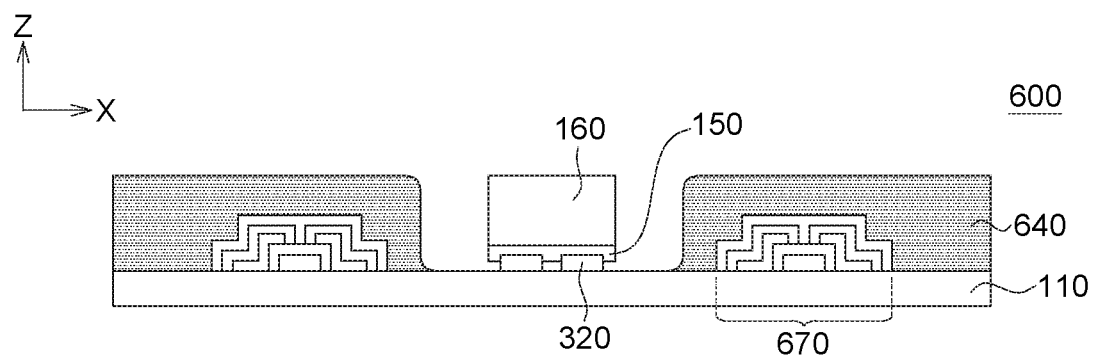
FIG. 8 is a cross-sectional view showing a panel according to a further embodiment of the present disclosure.

FIG. 8 is a cross-sectional view of a panel 600 according to a further embodiment of the present disclosure. The panel 600 is different from the panel 400 of FIG. 6 in that the shielding layer 640 directly contacts the driving element 670. The material of the shielding layer 640 may be an insulating coating comprising nano carbon material mixed insulating material and has an insulating property. The shielding layer 640 and the shielding layer 140 described above may have the same or similar reflectivity, formation manner and dimensional design, and the repeated description will not be described.

Figure 9:
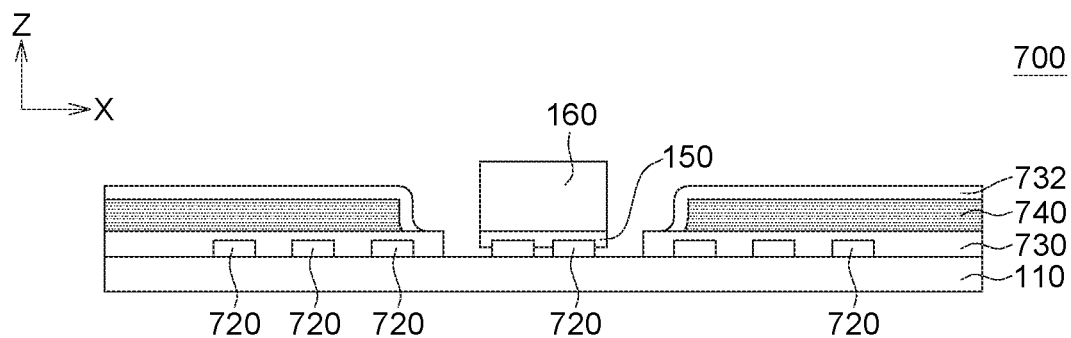
FIG. 9 is a cross-sectional view showing a panel according to a further embodiment of the present disclosure.

FIG. 9 is a cross-sectional view of a panel 700 according to a further embodiment of the present disclosure. The panel 700 is different from the panel 300 of FIG. 5 in that the shielding layer 740 further has a protective layer 732 thereon. The protective layer 732 can cover the shielding layer 740, a portion of the insulating layer 730 is exposed, and the periphery of the light-emitting element 160 is surrounded. The protective layer 732 may comprise an insulating material to further protect the shielding layer 740.

Figure 10:
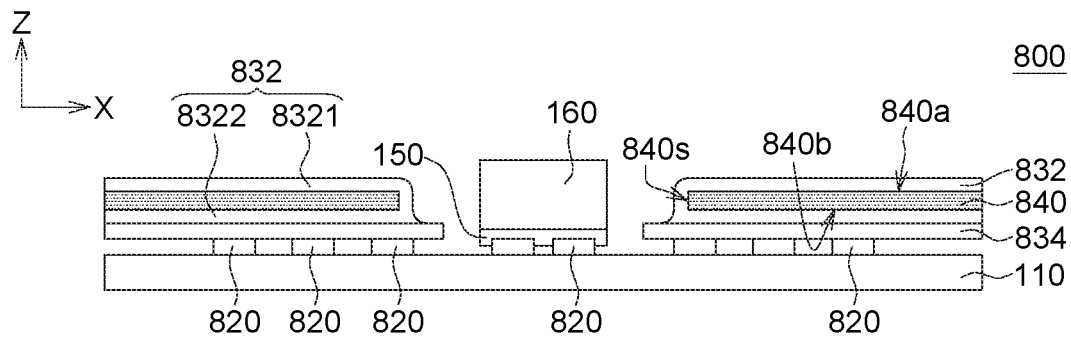
FIG. 10 is a cross-sectional view showing a panel according to a further embodiment of the present disclosure.

FIG. 10 is a cross-sectional view of a panel 800 according to a further embodiment of the present disclosure. The panel 800 is different from the panel 700 of FIG. 9 in that a portion of the protective layer 832 (protective layer 8321) can be disposed on a top surface 840a and the side surface 840s of the shielding layer 840, and another portion of protective layer 832 (protective layer 8322) is disposed on the lower surface 840b of the shielding layer 840. A portion of the protective layer 832 (protective layer 8321) and another portion of the protective layer 832 (protective layer 8322) may be the same layer or different layers. Since the protective layer 832 can electrically isolate the conductive layer 820 from the shielding layer 840, an insulating layer covering the conductive layer 820 can be omitted. In one embodiment, the shielding layer 840 and the protective layer 832 are adhered to the substrate 110 through the adhesive layer 834 after the protective layer 832 covering the shielding layer 840 is formed.

Figure 11:
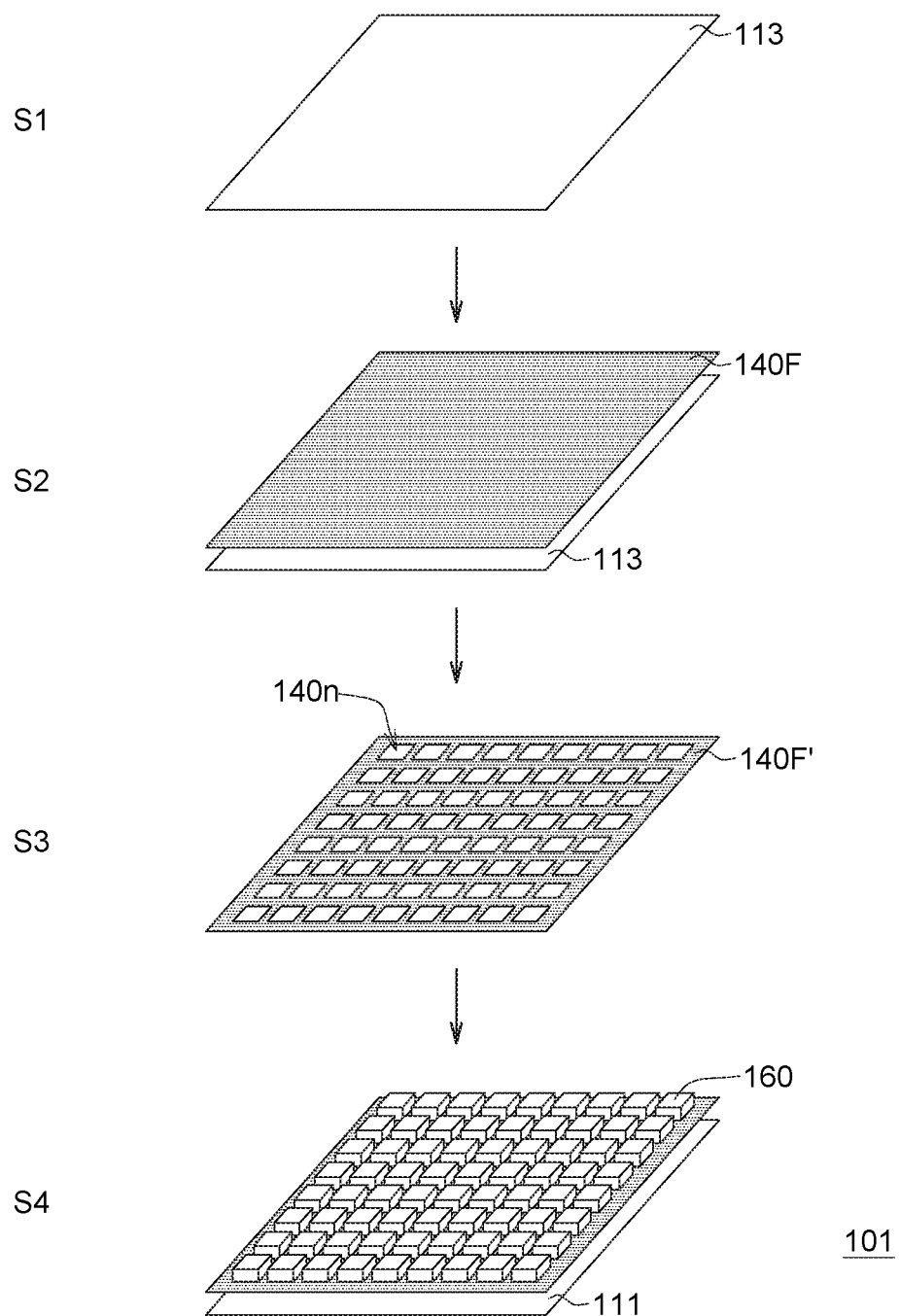
FIG. 11 is flow chart showing a manufacturing method of a panel according to a further embodiment of the present disclosure.

FIG. 11 illustrates a method of manufacturing a panel 101 according to a further embodiment of the present disclosure. Referring to FIG. 11, in step S1, a substrate 113 is provided. Next, in step S2, the shielding layer 140F is disposed on the substrate 113 to be molded. The material of the shielding layer 140F may include a nano carbon material or other suitable materials as described above. In an embodiment, a protective layer (not shown) may be selectively disposed on the top surface, the side surface, and/or the lower surface of the shielding layer 140F. The protective layer can be an insulating material. In step S3, after the shielding layer 140F is released from the substrate 113, a plurality of openings 140n are formed in the shielding layer 140F to form the patterned shielding layer 140F', or the shielding layer 140F is firstly patterned to be a patterned shielding layer 140F', and then released from substrate 113. The openings 140n may correspond to the light-emitting elements 160 (shown in step S4), respectively. The opening 140n is, for example, an array of rectangular openings formed by a punch. The shape of the opening 140n may be, for example, a circular shape, an elliptical shape or other shape, and is not limited thereto. The manufacturing method may also be, for example, a photolithography and etching process. In step S4, the shielding layer 140F is transferred onto the first substrate 111 on which the light-emitting elements 160 are formed, so that each of the openings 140n can correspond to and expose the light-emitting element 160 to form the panel 101.

Figure 12:
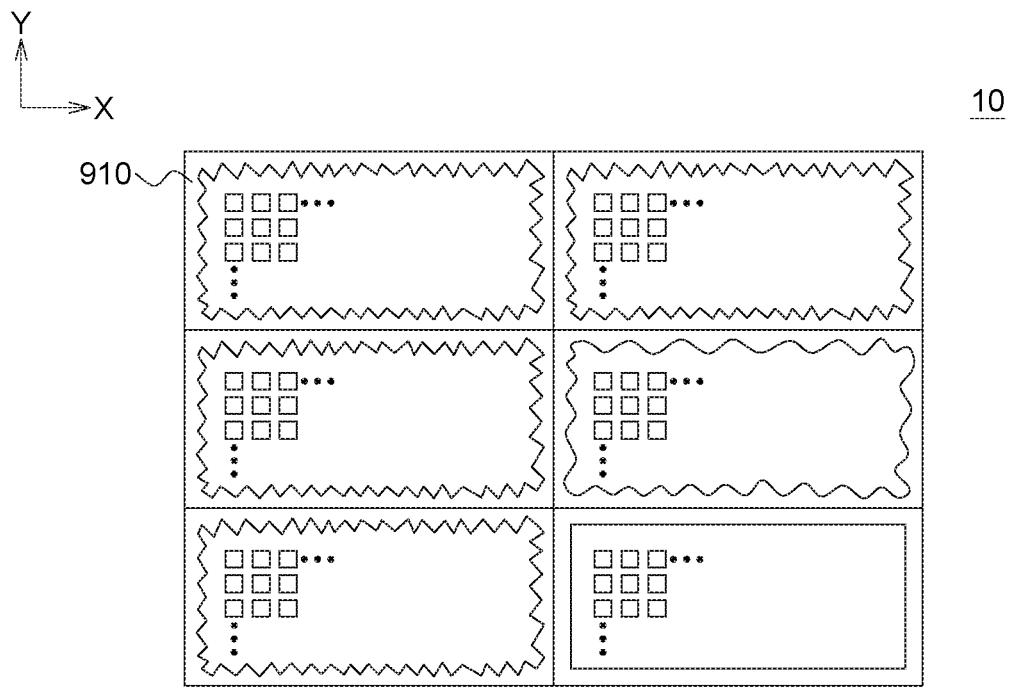
FIG. 12 is a top view showing a tiled device according to one embodiment of the present disclosure.

FIG. 12 is a top view of a tiled device 10 according to an embodiment of the present disclosure.

Referring to FIG. 12, the tiled device 10 may be formed by splicing a plurality of panels. In the present embodiment, the tiled device 10 may be formed by a plurality of panels 910 of the same size, such as any one of the panels 100, 100', 200, 300, 400, 500, 600, 700, 800 described above or an arbitrary combination thereof.

Figure 13:
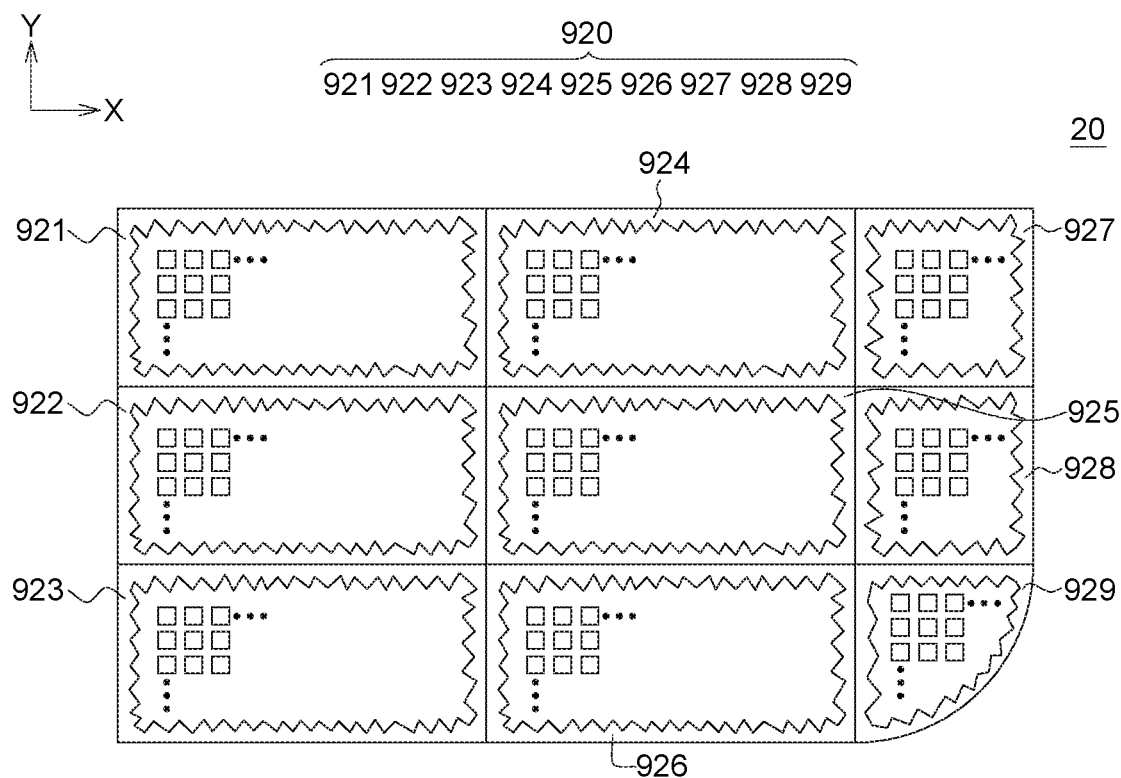
FIG. 13 is a top view showing a tiled device according to another embodiment of the present disclosure.

FIG. 13 is a top view showing a tiled device 20 according to an embodiment of the present disclosure.

Referring to FIG. 13, the tiled device 20 may be formed by splicing a plurality of panels. In the present embodiment, the tiled device 20 may be formed by a plurality of panels 921 to 929 having different sizes. For example, the display areas of the panels 921 to 929 are different, or the total lengths of edges of the panels 921 to 929 are different. The panels 921 to 929 are, for example, any one of the above-described panels 100, 100', 200, 300, 400, 500, 600, 700, 800 or an arbitrary combination thereof. In some embodiments, the tiled device 20 can be assembled from panels of the same or different shapes, depending on design requirements.

Since the panel and the tiled device of the present disclosure have a shielding layer, it can effectively absorb the reflected light caused by ambient light. Even if it comes to the outside, the panel can still have excellent display quality under the strong ambient light, and the color can still be presented realistically. The panel or tiled device of the present disclosure may have a touch function or a biometric detection function (such as fingerprint recognition).

The shielding layer of the present disclosure can also be applied to an electronic device or a tiled electronic device that requires low reflectivity or low gloss unit, and the shielding layer can be disposed in a region requiring low reflectivity or low gloss unit or disposed on a metal trace to reduce the reflectivity or gloss unit. The electronic device may not have a display function, that is, there is no light-emitting element, but the substrate has a design of a metal pattern, a trace, or a circuit. The electronic device may also have a touch function or a biometric detection function (such as fingerprint recognition).

While the invention has been described by way of example and in terms of the above embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A panel comprising:
   a substrate having a top surface;
   a plurality of light-emitting elements disposed on the top surface of the substrate;
   a shielding layer disposed between the plurality of light-emitting elements, wherein the shielding layer has a gloss unit lower than 100;
   a conductive layer disposed on the top surface of the substrate; and
   an insulating layer disposed between the conductive layer and the shielding layer.

2. The panel according to claim 1, wherein the shielding layer has a side surface having an uneven profile.

3. The panel according to claim 1, wherein the shielding layer has a top surface, a vertical height between at least a portion of the top surface of the shielding layer and the top surface of the substrate is gradually decreased or increased from a connecting surface between one of the plurality of light-emitting elements and the shielding layer to a direction away from the one of the plurality of light-emitting elements.

4. The panel according to claim 1, wherein the shielding layer comprises nano carbon material.

5. The panel according to claim 1, wherein a first height is between a top surface of each of the plurality of light-emitting elements and the top surface of the substrate, a second height is between a top surface of the shielding layer and the top surface of the substrate, and the first height and the second height meet the following Formula 1:

$$0.01*H_1<H_2<2*H_1 \quad \text{Formula 1;}$$

wherein $H_1$ is the first height and $H_2$ is the second height.

6. The panel according to claim 1, wherein the shielding layer has a reflectivity lower than 10%.

7. The panel according to claim 1, wherein a first height is between a top surface of each of the plurality of light-emitting elements and the top surface of the substrate, a second height is between a top surface of the shielding layer and the top surface of the substrate, and the first height and the second height meet the following Formula 2:

$$0.01*H_1<H_2<H_1 \quad \text{Formula 2;}$$

wherein $H_1$ is the first height and $H_2$ is the second height.

8. The panel according to claim 1, wherein a first height is between a top surface of each of the plurality of light-emitting elements and the top surface of the substrate, a second height is between a top surface of the shielding layer and the top surface of the substrate, and the first height and the second height meet the following Formula 3:

$$H_1<H_2<2*H_1 \quad \text{Formula 3;}$$

wherein $H_1$ is the first height and $H_2$ is the second height.

9. The panel according to claim 1, wherein the conductive layer comprises a plurality of wires, and the wires are separated by the insulating layer.

10. The panel according to claim 1, wherein at least a portion of a side surface of one of the plurality of light-emitting elements is exposed by the shielding layer.

11. The panel according to claim 1, wherein the shielding layer has a gap with one of the plurality of light-emitting elements.

12. The panel according to claim 1, further comprising a driving element disposed on the top surface of the substrate, wherein the shielding layer covers the driving element.

13. The panel according to claim 12, wherein the shielding layer directly contact the driving element.

14. The panel according to claim 1, further comprising a protective layer covering the shielding layer.

15. The panel according to claim 14, the shielding layer further comprises a top surface and a side surface, wherein a portion of the protective layer is disposed on the top surface of the shielding layer and the side surface of the shielding layer, and the shielding layer is disposed between the portion of the protective layer and an another portion of the protective layer.

16. The panel according to claim 1, wherein a top surface of the shielding layer has an uneven surface.

17. A tiled device comprising a plurality of panels;
    wherein each of the panels comprises:
        a substrate having a top surface;
        a plurality of light-emitting elements disposed on the top surface of the substrate;
        a shielding layer disposed between the plurality of light-emitting elements, wherein the shielding layer has a gloss unit lower than 100;
        a conductive layer disposed on the top surface of the substrate; and
        an insulating layer disposed between the conductive layer and the shielding layer.

18. The tiled device according to claim 17, wherein the plurality of panels have different sizes.

19. The tiled device according to claim 17, wherein the shielding layer of each of the plurality of panels comprises nano carbon material.

20. A panel comprising:
    a substrate having a top surface;
    a plurality of light-emitting elements disposed on the top surface of the substrate; and
    a shielding layer disposed between the plurality of light-emitting elements, wherein the shielding layer has a gloss unit lower than 100;
    wherein a first height is between a top surface of each of the plurality of light-emitting elements and the top surface of the substrate, a second height is between a top surface of the shielding layer and the top surface of the substrate, and the first height and the second height meet the following Formula 1:

$$0.01*H_1<H_2<2*H_1 \quad \text{Formula 1;}$$

wherein $H_1$ is the first height and $H_2$ is the second height.

* * * * *